United States Patent [19]

Fulton et al.

[11] Patent Number: 4,470,190

[45] Date of Patent: Sep. 11, 1984

[54] JOSEPHSON DEVICE FABRICATION METHOD

[75] Inventors: Theodore A. Fulton, Warren Township, Somerset County; Shin-Shem Pei, New Providence, both of N.J.

[73] Assignee: AT&T Bell Laboratories, Murray Hill, N.J.

[21] Appl. No.: 445,290

[22] Filed: Nov. 29, 1982

[51] Int. Cl.$^3$ .................... H01L 39/22; H01L 21/265
[52] U.S. Cl. ..................................... 29/576 B; 29/571; 29/578; 148/1.5; 148/174; 148/180; 357/5
[58] Field of Search ..................... 29/271, 278, 276 B; 357/5; 148/1.5, 174, 180, 190

[56] References Cited

U.S. PATENT DOCUMENTS

| | | | |
|---|---|---|---|
| 3,521,133 | 7/1970 | Beam | 357/5 |
| 3,897,276 | 7/1975 | Kondo | 148/1.5 |
| 3,966,501 | 6/1976 | Nomura et al. | 148/1.5 |
| 4,050,967 | 9/1977 | Rosnowski et al. | 148/174 X |
| 4,176,365 | 11/1979 | Kroger | 357/5 |
| 4,263,603 | 4/1981 | Jillie | 357/5 |

OTHER PUBLICATIONS

Harris, "Preperation of Superconducting Weak Links . . . by Ion Implantation". IEEE Trans Magn. vol. May 11, No. 2, Mar. 1975, pp. 785–788.
"An Overview of Materials and Process Aspects of Josephson Integrated Circuit Fabrication", I. Ames, *IBM Journal of Research and Development,* vol. 24(2), pp. 188–194 (1980).
"Niobium Oxide–Barrier Tunnel Junction", R. F. Broom et al., *IEEE Transactions on Electron Devices,* vol. ED-27(10), pp. 1998–2008, Oct. 1980.
"Electron Irradiation Effects in Lead–Alloy Josephson Junctions", by Y. H. Lee and P. R. Brosious, *Applied Physics Letter,* vol. 40(4), 1982, pp. 347–349.
*Projected Range Statistics,* 2nd ed. Dowden, Hutchinson and Ross, Inc. (1975) by J. F. Gibbons et al.
*Metals Reference Book,* vol. II, 4th edition, Plenum Press, 1967, by C. J. Smithells.
*Constitution of Binary Alloys,* (2nd edition, McGraw-Hill, 1958.)
"Computing at 4 Degrees Kelvin", by W. Anacker, *IEEE Spectrum,* May 1979, pp. 26–37.
"Fabrication Process for Josephson Integrated Circuits", by J. H. Greiner et al., *IBM Journal of Research and Development* vol. 24(2), Mar. 1980, pp. 195–205.
"Advanced Superconducting Materials for Electronic Applications", by M. R. Beasley, *IEEE Transactions on Electron Devices,* vol. ED-27(10), pp. 2009–2015.
"Effect of Process Variables on Electrical Properties of Pb Alloy Josephson Junctions", by R. F. Broom et al., *IBM Journal of Research and Development,* vol. 24(2), Mar. 1980, pp. 206–211.

*Primary Examiner*—Brian E. Hearn
*Assistant Examiner*—David A. Hey
*Attorney, Agent, or Firm*—Eugen E. Pacher

[57] ABSTRACT

A method for changing Josephson device parameters, e.g., the critical current of a Josephson junction. The method comprises incorporating doping material into the device, or part of the device, followed by a light anneal. Exemplary dopants include In, Sn, Sb, Te, Bi, Hg, Mg, Li, Cd, Na and Ta, with In, Sn, and Sb being preferred dopants for changing the critical current of a Josephson junction having a Pb-containing counter electrode. The dopant can be incorporated into the device by in-diffusion after deposition onto the surface, by ion implantation, or by any other convenient method. The amount of dopant required is typically small. For example, deposition of a Sn layer of 0.05 nm effective thickness onto the 200 nm thick Pb-Sb(1.5 wt. %) counter electrode of a cross-type Josephson junction, and annealing at 80° C. for about 3 hours, resulted in an increase in the critical current of the junction by a factor of about 2.5. The method is considered to have wide applicability in the manufacture of Josephson devices, and can be applied globally, i.e., to all the devices on a wafer or chip, or locally, i.e., to selected devices.

20 Claims, 7 Drawing Figures

JOSEPHSON DEVICE FABRICATION METHOD

FIELD OF THE INVENTION

This invention pertains to superconductive tunneling (Josephson) device manufacturing methods.

BACKGROUND OF THE INVENTION

The Josephson effect was discovered in 1962, and it soon found practical application as a research tool. The effect can, inter alia, also be used to make an extremely fast electronic switch, generally referred to as the Josephson junction. In addition to its sort switching time, the Josephson junction also has very low energy dissipation. Primarily because of these two characteristics, the Josephson junction can be used in devices or circuits, to be referred to as "Josephson devices", that are, inter alia, considered for use in future electronic computers. See, for instance, W. Anacker, *IEEE Spectrum*, May 1979, pp. 26–37, incorporated herein by reference, where the theory underlying the operation of Josephson junctions and devices is discussed, and junction parameters are defined. These aspects of Josephson device technology will therefore not be further discussed herein.

During a typical fabrication process for an (integrated) Josephson device more than a dozen different layers are usually deposited. However, the essential elements of a Josephson junction are a superconducting base electrode, a thin tunneling layer or barrier covering the base electrode in the junction region, and a superconducting counter electrode, overlying the tunnel layer. For a description of the structure and the fabrication process, see, for instance, J. H. Greiner et al, *IBM Journal of Research and Development*, Vol. 24(2), March 1980, pp. 195–205, incorporated herein by reference.

The base electrode material may be a Pb-In-Au alloy, and the counter electrode material a Pb-Bi alloy. A junction-defining thick dielectric layer between base and counter electrodes typically consists of vacuum-deposited SiO, and the tunnel layer typically is native oxide grown on the exposed base electrode surface prior to the deposition of the counter electrode material.

Formation of the tunnel barrier is probably the most critical step in the fabrication of Josephson devices, and has received a great deal of attention. Since the Josephson (pair) current and the single-electron (or quasi-particle) tunneling currents depend exponentially on the product of the tunneling barrier thickness and the square root of the barrier height times the effective mass of the tunneling particles, precise control of the tunnel barrier layer thickness and composition are required in order to achieve reproducible values of the tunneling current. For instance, for a typical tunnel barrier having a tickness of 4 nm, a thickness deviation of only 0.4 nm causes the value of the Josephson critical current, an important junction parameter, to vary by a factor of about 10.

The tunnel barrier is, for instance, formed by placing the bared junction region of the base electrode into a radio frequency glow discharge established in a low-pressure, pure-oxygen atmosphere in a vacuum chamber. Although this process permits relatively close control over barrier layer formation, there typically still exist substantial variations of device parameters, e.g., of the critical current, between devices fabricated on the same substrate wafer, as well as between devices on different wafers manufactured either during one and the same barrier layer formation run, or in different runs. However, for instance, for computer applications of Josephson devices, it is desirable, if not economically imperative, that many such devices, typically hundreds, perhaps thousands, be placed on the same substrate chip, and many chips be prepared simultaneously, and that these devices be closely matched in their properties. For instance, present design criteria typically call for the critical currents to be within 10 percent of the target value. Because such close intra- and inter-wafer (or chip) tolerances are difficult to achieve during the junction formation process, techniques for trimming or adjusting junction or device parameters subsequent to the formation of the junction on the device are being sought.

It has been shown that the critical current of Pb-Bi alloy junctions may be changed substantially "globally", i.e., essentially simultaneously in all, or at least a substantial fraction of all, junctions on a chip (or wafer), by annealing the chip (or wafer) at an elevated temperature (R. F. Broom et al, *IBM Journal of Research and Development*, Vol. 24(2), March 1980, pp. 206–211). Typical annealing temperatures and times were 80° C. and one hour, respectively.

"Local" critical current adjustment, i.e., selective adjustment of individual junctions, has been accomplished by irradiating particular junctions with energetic electrons ($>5$ keV, ibid). The observed changes in the critical current and the room temperature resistance of thus irradiated junctions were attributed to the creation of disorder in the barrier oxide layer by the energetic electrons. An increase in the critical current by 50 percent was reported for an electron dosage of 0.1 $C/cm^2$ and an accelerating voltage of 30 kV.

Electron irradiation of lead-alloy Josephson junctions has also been reported by Y. H. Lee and P. R. Brosious, *Applied Physics Letter*, Vol. 40(4), 1982, pp. 347–349. These workers show that, under the conditions used by them, radiation-induced point defects within the tunnel barrier are responsible for the observed changes in both the tunneling current and the annealing characteristics of the junctions.

Prior art methods of altering Josephson junction parameters thus appear to achieve their end by means of altering the state of the barrier oxide, e.g., by means of annealing (which can be expected to result in relaxation of the barrier layer towards equilibrium), or by means of electron bombardment (which typically results in increased disorder in the barrier layer).

Because of the importance of the problem of excessive parameter scatter among Josephson devices on the same chip or wafer, or scatter from wafer to wafer, it is highly desirable to have a variety of trimming techniques available, such as to be able to choose the one suitable for a particular processing technique and/or particular device. Furthermore, it is desirable to have available a trimming technique that allows close control over the amount of resulting change in device parameter, that is fully compatible with current Josephson device manufacturing techniques, that does not adversely affect device stability, and that can easily be applied globally as well as locally. We will be disclosing such a technique below.

DEFINITIONS

A "superconducting" material is a material which can undergo a superconducting/normal transition at a finite transition temperature. Typically the transition temperature is greater than 4.2° K.

A "Josephson junction" is a thin-film superconducting tunneling junction comprising a superconducting base electrode, a tunnel barrier layer on at least a part of the base electrode, and a superconducting counter electrode overlying the barrier layer.

A "Josephson device" is an electronic device or circuit comprising one or more Josephson junctions, as well as other and distinct components such as resistors, conductors, transmission lines, inductors, and capacitors. Some or all of these other device components may comprise superconducting materials, to be referred to as "superconducting device components". Those components that do not comprise superconducting materials will be referred to as "normal device components". For ease of exposition, we intend the term "Josephson device" to also include, where appropriate, "Josephson device component".

A "dopant" or "doping material" is a chemical species that is incorporated into an existing Josephson device (comprising the "matrix"), with the dopant species being present in the matrix, prior to incorporation therein of the dopant, at most in small concentration, typically less than 1% by weight.

By a "chemical" process for trimming Josephson device parameters we mean herein a trimming process involving interaction between one or more chemical species present in the matrix and dopant material.

A "reactive" dopant is a dopant which is capable of participating in a chemical device parameter trimming process, as defined above.

SUMMARY OF THE INVENTION

A method for fabricating Josephson devices is disclosed. The method comprises a device parameter trimming step after fabrication of the device. The device parameters of interest herein comprise the critical current or critical current density of a Josephson junction, the inductance of a superconducting device component, the quasi-particle resistance of a Josephson junction, and the resistivity of a normal device component.

The method comprises incorporating an effective amount of dopant, typically reactive dopant, into the device, e.g., the counter electrode of a Josephson junction. It also typically comprises maintaining the device at a reaction temperature for an effective time, thereby causing a chemical trimming process to proceed. Incorporation of the dopant can be by means of vapor or sputter deposition, followed by in-diffusion, by means of ion implantation, or by any other convenient method.

A preferred application of the invention is for trimming the critical current of a Josephson junction. In this application, it is often advantageous to deposit the dopant on or into the counter electrode such that deposition does not result in initial placement of a substantial amount of the material at or close to the counter electrode/tunnel barrier interface.

The dopant advantageously is a reactive dopant. For instance, for trimming of the critical current or current density of a Josephson junction, the dopant advantageously is selected to have an oxygen affinity greater than the oxygen affinity of any major chemical constituent of the matrix. Such a dopant typically causes chemical processes to occur at the interface and/or in the barrier oxide layer or the counter electrode.

The effective amount of dopant incorporated into the matrix is no more than a few weight percent, typically less than 10%, and for some applications, it is very much less than 10%. The reaction temperature is typically relatively low, depending on the matrix material. For instance, for Pb-based matrices, the reaction temperature is typically less than about 200° C., often between about 50° C. and about 150° C. The effective time for producing the change in the device parameter typically is of the order of hours, often less than ten hours. Exemplary dopant species are In, Sn, Sb, Te, Bi, Au, Hg, Mg, Li, Cd, and Na. All these species diffuse easily at relatively low temperatures in Pb, a common major constituent of Josephson junction counter electrode material, and thus can reach the counter electrode/barrier layer interface after being deposited on or near the top surface of the counter electrode.

DETAILED DESCRIPTION

Figure 1:
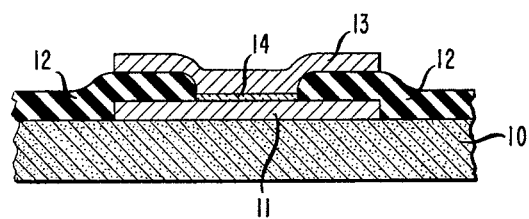
FIG. 1 schematically shows a Josephson junction in cross section.

Josephson device performance is a function of the values of a number of device characteristics, e.g., the critical (Josephson) current, the quasi-particle tunneling current, the penetration depth, coherence length, and energy gap of superconducting material in the device, and of the electron mean free path in normal material. The values of these characteristics can typically be trimmed, according to the invention, by incorporating dopant material into the device, thereby bringing about a change in one or more device parameters, e.g., the critical current or current density, the quasi-particle resistance, the inductance of a superconducting component or the resistivity of a normal component.

It is to be emphasized that we do not contemplate introducing dopant material into the device during fabrication of the device. Instead, we intend that the introduction of dopant material take place after fabrication of the device, typically after actually measuring the value of one or more device parameters. This, however, does not mean that device or circuit processing has to be completed before introduction of the dopant, only that a functioning device has to exist. In fact, since Josephson devices typically are covered with a protective coating (e.g., SiO) and often also are further encapsulated, the inventive method typically could not be practiced on completely finished devices. As an example, dopant for trimming a Josephson junction characteristic, e.g., the critical current, the energy gap or the penetration depth of the electrode material, is advantageously introduced into the counter electrode. This, of course, implies that the dopant is introduced after fabrication of the complete Josephson junction, i.e., after formation of the counter electrode. The counter electrode fabrication process, however, may entail sequential deposition of different materials, and such sequential fabrication deposition is to be distinguished from dopant deposition according to the invention. As further examples, the penetration depth of superconducting transmission line material (and therefore the characteristic impedance of the transmission line), or the electron mean free path in low-conductivity normal material (and therefore the sheet resistance of a resistor formed therefrom) is trimmed, according to the invention, by introducing dopant into the materials after formation of the transmission line or the resistor, respectively.

The dopant material can be introduced into the device by any appropriate technique. Preferred techniques are deposition onto the device surface by, e.g., vapor or sputter deposition, followed by in-diffusion, typically during an annealing treatment, or ion implantation. Although the ion energy can, in principle, be so large that the penetration depth of the dopant ions is comparable to the relevant device thickness, this is typically not preferred. Instead, the preferred approach is to use ions of relatively low energy, such that the projected range or penetration depth is smaller than the relevant device thickness, typically less than half. Herein "projected range" is used in the usual way. For details, see, for instance, J. F. Gibbons et al, *Projected Range Statistics*, 2nd ed., Dowden, Hutchinson and Ross, Inc. (1975). The "relevant device thickness" is, for instance, the counter electrode thickness in a Josephson junction, the thickness of the superconducting layer in a superconducting transmission line, or the thickness of the normal conducting layer in a thin film resistor.

The amount of dopant introduced is typically small. In terms of weight, it is typically less than 10 weight percent (wt. %) of the device material into which the dopant is incorporated. This measure is typically most appropriate if the dopant will be more or less uniformly distributed throughout a device component or part thereof. Another measure, most appropriate when ion implantation is used, is the number of dopant atoms implanted per unit area. And a further measure, typically most useful when vapor or sputter deposition of dopant is used, is the "effective thickness" of the deposited dopant layer. By this is meant the thickness of a hypothetical uniform and continuous layer formed by the deposited material. Typically this is less than about 10 nm. For instance, an effective amount of dopant for trimming the critical current of a Josephson junction corresponds to an effective thickness of the order of 0.5 nm. If the same amount of dopant were implanted, it would correspond to about $2.10^{15}$ atoms/cm$^2$.

After introduction of the dopant into the device material, the dopant atoms typically are caused to undergo diffusion. Dopant materials therefore advantageously are selected from those materials that diffuse relatively easily in the relevant device material. As an example, In, Sn, Sb, Te, Bi, Au, Hg, Mg, Li, Cd, and Na diffuse readily in Pb, a common material in Josephson devices, and thus are potentially useful dopants in Pb-containing matrices, whereas Ta is a useful dopant in Nb-containing matrices. Diffusion data for potential dopant/matrix combinations can be obtained from standard metallurgical works, e.g., C. J. Smithells, *Metals Reference Book*, Vol. 2, 4th ed, Plenum Press (1967).

In addition to diffusing readily at a relatively low temperature in the relevant matrix, a dopant advantageously is a "reactive" dopant. For instance, the critical current of a Josephson junction can be modified by incorporating, e.g., In, Sb, or Sn into its Pb-Bi counter electrode, and maintaining the junction at about 80° C. for about one hour. All of these dopants have greater oxygen affinity than either Pb or Bi, and thus can replace Pb or Bi from oxide at or near the counter-electrode/barrier interface. Such a replacement constitutes a critical-current-trimming process, since the resulting change in the tunnel barrier typically produces a change in the critical current of the junction, and In, Sb, and Sn thus are exemplary reactive dopants in, e.g., a Pb-containing device component.

Device parameters can also be changed by, for instance, bringing about changes in the penetration depth, coherence length or energy gap of superconducting device material, or in the electron mean free path in normal device material, by introducing an appropriate reactive dopant into device material. For instance, incorporation of a dopant that forms an intermetallic compound with a constituent of the device material typically has a significant effect on electron mean free path, and therefore on the resistivity of a normal material. It can also have an appreciable effect on the above-mentioned characteristics of superconducting material, and thus result in changes in critical current, loop inductance, characteristic impedance, or internal resistance of superconducting device components. However, the above-mentioned material characteristics can often also be changed by inroduction of a dopant (or dopants) that form a solid solution with the device material, or that result in formation of multiphase material. Intermetallic-forming, solid-solution-forming, and multiphase-material-forming dopants can be determined by reference to the standard metallurgical literature, e.g., M. Hansen, *Constitution of Binary Alloys*, 2nd ed., McGraw-Hill (1958), and supplement thereto. The above three processes involve interaction between matrix atoms and dopant atoms, and therefore are examples of processes that can be used in a chemical trimming process according to the invention.

For a chemical trimming process to proceed at a practical rate, it is typically necessary to maintain the dvice, or at least the relevant part of the device, at some elevated temperature, the reaction temperature, for some extended time, the reaction time. In devices containing Pb as a major constituent, reaction temperatures are typically quite low, usually not exceeding 200° C., preferably between about 50° C. and about 150° C., and reaction times typically do not exceed 10 hours. In Nb-containing matrices, advantageous reaction temperatures often exceed 500° C. Reaction temperatures and times must, of course, be chosen such that other device characteristics are not adversely affected to any significant degree by the above annealing process. Such considerations are familiar to those skilled in the art.

The inventive doping treatment can be applied globally or locally. In the former case, dopant is to be deposited onto and/or incorporated into the top material layer of a wafer, a chip, or any other substrate arrangement containing a multiplicity of Josephson devices.

We are using "wafer" and "chip" in their usual sense, i.e., a wafer is a piece of material, typically a thin slice of semiconductor, on which (or in which) a multiplicity of devices are fabricated. Typically, the pattern of devices is repeated over the wafer. A piece of material which carries such a repeat unit of device pattern is a chip.

Global doping is advantageously used if there exists wafer-to-wafer or chip-to-chip device parameter spread, with the deviation from the target value being substantially uniform over the wafer or chip. On the other hand, if the deviation is not uniform, for instance, iif "maverick" devices exist on a chip or wafer, local doping can be advantageously used. After identification of devices requiring such treatment, dopant is deposited on, or incorporated into, the top material layer of the devices. This can, for instance, be easily accomplished by means of a fine-focus ion beam system. Such systems are known in the art. It can also be accomplished by any appropriate masking technique, such as are practiced in integrated semiconductor processing, e.g., by spinning on of a positive resist layer, exposure with a direct writing beam, and development of the resist layer. Incorporation of dopant into the matrix can be either substantially spatially uniform over the device, or nonuniform. Nonuniform incorporation is easily accomplished by ion implantation.

We will now give specific examples of the general inventive technique described above. In particular, we will discuss the trimming of the critical current of Josephson junctions by means of incorporation of reactive dopant into the counter electrode. This constitutes a preferred application of the inventive method.

In realistic Josephson junctions, several layers of material are typically deposited prior to deposition thereon of the base electrode. Examples of such layers are a superconducting ground plane, one or more layers of ground plane insulation, and a resistor layer. These layers, some or all of which may be patterned, are typically formed on a slice of Si or other appropriate material, and we consider this combination to form the substrate for the base electrode.

FIG. 1 schematically shows a Josephson junction in cross section. Layers not relevant to the instant discussion are omitted. Base electrode 11 on substrate 10 is covered by dielectric comprising a relatively thick window-defining layer 12 and the relatively thin tunnel barrier layer 14 in the window formed by dielectric 12. Counter electrode 13 overlies layer 14 as well as at least part of layer 12, and thus is electrically insulated from base electrode 11.

The superconducting base electrode layer can be formed and patterned by any appropriate deposition process and patterning process, respectively. These processes are described by J. H. Greiner et al (op. cit.). Similarly, the window-defining dielectric layer 13 can be formed and patterned by any appropriate process, e.g., by vacuum deposition of SiO from a heated source, followed by patterning by a lift-off technique, and photolithography.

Formation of the tunnel barrier layer (reference numeral 14 of FIG. 1) is the key step in Josephson device manufacture, especially when simultaneously manufacturing a substantial number of junctions, as typically occurs when producing Josephson logic or other devices for computer applications. A variety of processes can be used for forming the tunnel barrier layer, e.g., thermal oxidation, or oxidation in a DC glow discharge. Another approach comprises cleaning of the base electrode surface in the window region and barrier formation by sputter etching in a low pressure RF oxygen discharge.

Subsequent to formation of the tunnel barrier layer, the counter electrode material is deposited by any appropriate technique, e.g., by vapor deposition. This is typically done, in situ, soon after barrier layer formation, thereby reducing the possibility of unwanted and uncontrolled modification of the barrier layer. An exemplary layer of counter electrode material is a 400 nm thick layer of Pb-Bi (29 wt. %), deposited by evaporation from a source of the same composition. Following deposition, the counter electrode material is typically patterned to yield the desired electrode configuration. Patterning can be by any appropriate process, such as by means of standard photolithography and dry etching.

In subsequent processing steps, a counter electrode protection layer, controls, interconnections, insulation layers, and contacts, as well as a protective coating, are typically deposited and, where applicable, patterned. These subsequent steps are conventional and will not be further discussed.

Details of Josephson device fabrication are given by Greiner et al (op. cit.). See also R. F. Broom et al, *IBM Journal of Research and Development*, Vol. 24(2), pp. 206–211, I. Ames, ibid., pp. 188–194, R. F. Broom et al, *IEEE Transactions on Electron Devices*, Vol. ED-27(10), pp. 1998–2008, and M. R. Beasley, ibid., pp. 2009–2015.

After completion of the Josephson junctions, the critical currents of all, or a sample, of the junctions, are typically measured and the junctions requiring trimming thereby identified. The measurement procedures are familiar to those skilled in the art.

Figure 2:
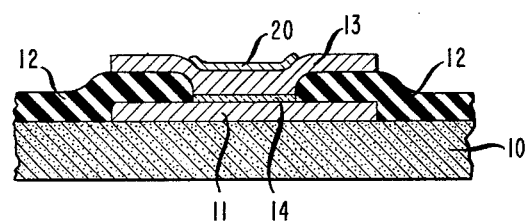
FIG. 2 schematically shows a Josephson junction in cross section, with dopant material deposited "locally" onto the counter electrode.
Figure 3:
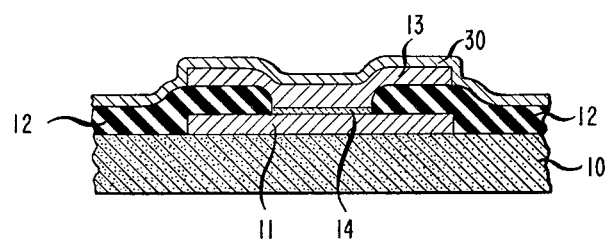
FIG. 3 schematically shows a Josephson junction in cross section, with dopant material deposited "globally"

To the thus identified junctions, the inventive trimming is then applied. This is schematically illustrated in FIGS. 2 and 3. FIG. 2 shows a (simplified) Josephson junction, identical to that shown in FIG. 1, with, as is the case for all the figures herein, like parts being labeled by like reference numerals. On the top surface of the counter electrode is shown dopant 20, deposited there by, e.g., masking and vapor deposition. FIG. 2 thus illustrated local doping. Global doping is illustrated by FIG. 3, which also shows the simplified junction of FIG. 1, with the dopant layer 30 extending beyond the junction region, e.g., over the whole chip or wafer.

Example

We fabricated cross-type Josephson junctions of 10 $\mu$m line width on oxidized Si substrates. There were arrays of 16 chains of 50 junctions on each 1 inch $\times$ 0.3 inch chip. Pb-In(8 wt. %)-Au(2 wt. %) base electrodes, with nominal thickness of 200 nm, were thermally evaporated, and patterned using photo-resist lift-off stencils. The tunneling barrier was the base electrode native oxide formed by DC flow discharge in oxygen. Thereon was deposited Pb-Sb(1.5 wt. %) counter electrode material, also nominally 200 nm thick, and patterned using photoresist lift-off stencils. All junctions were annealed at 80° C. for 4 hours prior to doping, with a layer of photoresist (AZ-1350J) used as protection during annealing. The junction formation procedure employed by us was largely conventional. Pb-Sb counter electrodes are disclosed in J. V. Gates-S. S. Pei 1-1, a U.S. patent application, entitled "Josephson Junction with Electrodes of an Pb-Sb Alloy," filed concurrently with the instant application.

Prior to deposition of the dopant the evaporation source was outgassed and cleaned by pre-evaporation, and exposed electrode surfaces were cleaned by sputter etching with argon ions, thereby removing oxide and other contaminants, in addition to about 20 nm of Pb alloy. These preparatory steps were carried out in a vacuum of pressure in the $10^{-8}$ Torr range. With vacuum pressure less than $3.5 \cdot 10^{-8}$ Torr, the dopant (Sn) was evaporated from a standard, feed-back stabilized, evaporation source. The dopant deposition rate was typically 0.025 nm/sec or higher, but typically less than 2 nm/sec. The amount of dopant deposited was controlled by means of a mechanical shutter. Onto the thus formed dopant layer was deposited a SiO protective layer, typically 30–200 nm thick, thereby protecting the electrode surfaces from oxidation upon removal of the chip from the vacuum system. This was followed by coating of the chip with photoresist, and annealing at 80° C. On each chip, several junctions typically were left undoped and served as controls.

Figure 4:
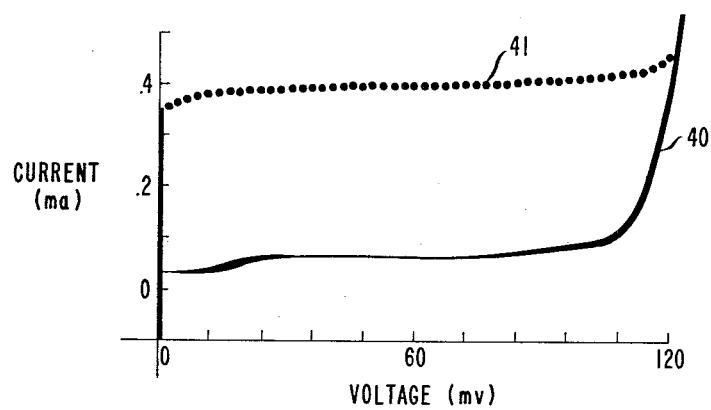
FIG. 4 shows an exemplary current/voltage characteristic obtained with 50 as-formed Josephson junctions in series.

FIG. 4 shows the experimentally determined current voltage characteristics of a chain of 50 Josephson junctions, prepared as described above, measured prior to doping. Such collective I-V characteristics are familiar to those skilled in the art. Suffice it to say, every dot of curve 41 corresponds to the switching of a single junction from the pair-tunneling to the quasi-particle-tunneling branch of its individual I-V characteristic. Thus, numeral 41 refers to the transition from the zero-voltage branch, and numeral 40 to the return transition to the zero-voltage branch.

Figure 5:
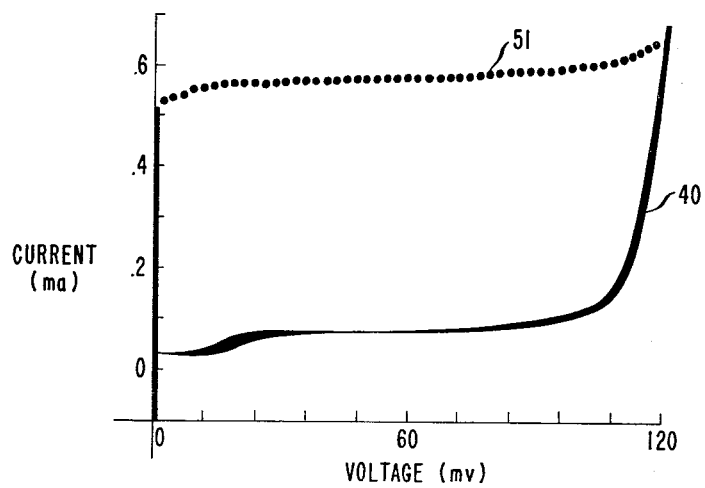
FIG. 5 shows the current/voltage characteristic obtained after subjecting the 50 Josephson junctions to the inventive critical-current-trimming process.

FIG. 5 shows the experimentally determined I-V characteristics of the same chain of junctions after subjecting them to the inventive critical-current trimming process, by doping them with Sn by the procedure described above, with numeral 51 referring to the transition from the zero-voltage branch. The effective thickness of the dopant deposit was about 0.025 nm, and annealing was about 2 hours at about 80° C. As FIG. 5 shows, doping resulted in an increase of the average critical current of the 50 junctions in the chain by about 40%. No deterioration of critical current uniformity and junction quality, e.g., gap sharpness and relative leakage current below the gap voltage, was observed. The same was found to be true for doses up to at least about 2 nm effective thickness.

Figure 6:
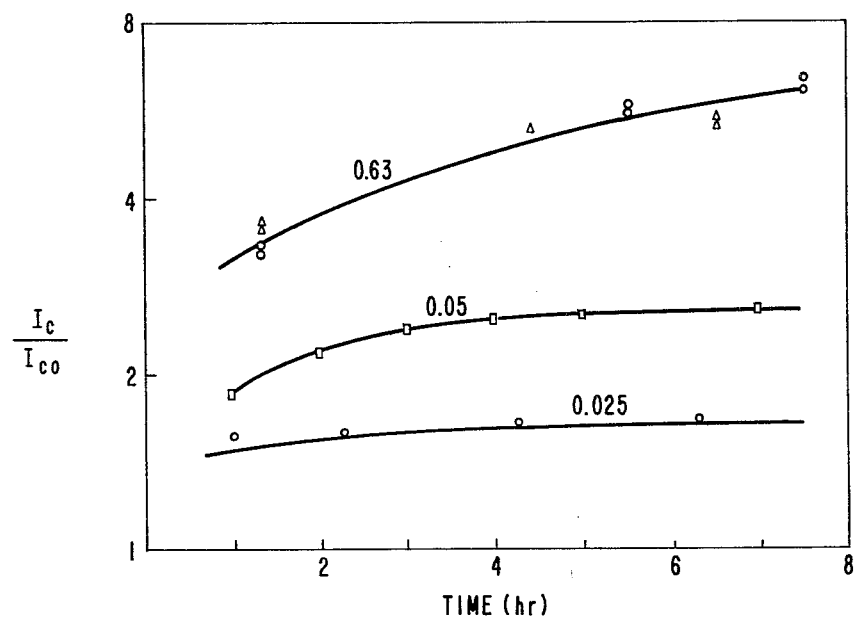
FIG. 6 shows data on the change in critical current of Josephson junctions as a function of time, for three different amounts of dopant.

FIG. 6 shows the normalized (by the pre-doping critical current $I_{co}$) dependence of the critical current $I_c$, of exemplary Josephson junctions as described above, as a function of annealing time, for three representative doping dosages, namely, for 0.025 nm, 0.05 nm, and 0.63 nm. The plot shows that the time required to reach the equilibrium value of critical current typically depends, inter alia, on the doping level. For practical doping levels in Josephson junctions, this time is typically less than about 10 hours at 80°–100° C. The plot also shows that the change in critical current typically increases with increasing doping dosage.

Figure 7:
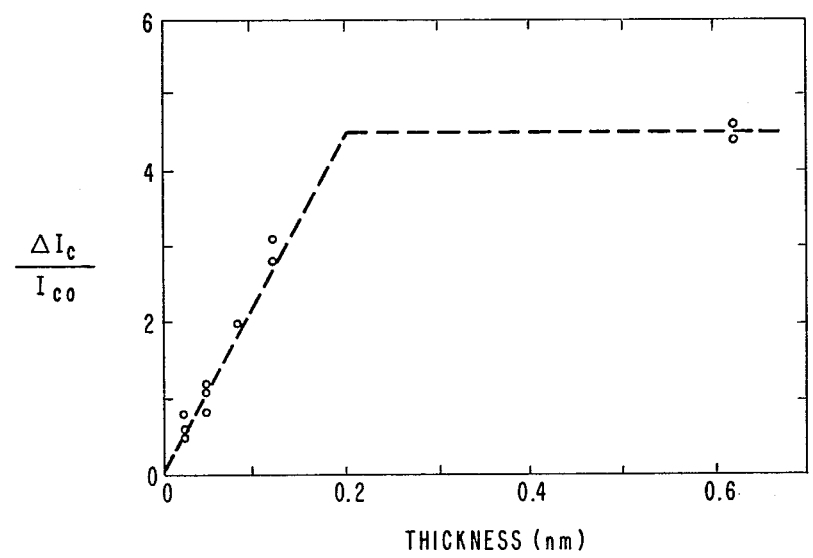
FIG. 7 shows data on the asymptotic change in critical current of Josephson junctions vs. the effective dopant layer thickness.

The dosage dependence is further illustrated by FIG. 7, which shows the equilibrium increment of critical current $\Delta I_c$, normalized to $I_{co}$, of Josephson junctions as described above, as a function of doping dosage, expressed in terms of the effective dopant layer thickness. The plot shows that, at least in this system, saturation occurs, with the increase depending substantially linearly on dosage up to about 0.2 nm, and the saturation value of the increment being about 5 $I_{co}$.

Similar trimming effects were observed on other Pb-alloy junctions, as well as on junctions having Nb base electrodes, and when using other reactive dopants. Some of these results are summarized in Table I, in which a "+" indicates observation of a substantial increase in junction critical current upon doping, and a "0" absence of a substantial doping effect on the critical curent. "na" is used to indicate that the "dopant" is not a dopant according to our definition.

TABLE I

| Dopant: | Counter Electrode Material | | |
|---|---|---|---|
| | PbAu | PbBi | PbSb |
| Au | na | 0 | 0 |
| Bi | 0 | na | 0 |
| Sb | + | + | na |
| Sn | + | + | + |
| In | + | + | + |

Table II shows the free energy of formation ($-\Delta G$ at 300° K.), the molecular volume of various oxides relevant to the practice of the instant invention, and the ratio of oxide molecular volume to the atomic volume of the relevant metal M.

TABLE II

| | $Bi_2O_3$ | PbO | $Sb_2O_3$ | $SnO_2$ | $In_2O_3$ |
|---|---|---|---|---|---|
| $-\Delta G$ (300° K.) (Kcal/mole $O_2$) | 80 | 90 | 98 | 124 | 134 |
| Mol. Vol. of $M_xO$ ($cm^3$) | 16.6 | 23.0 | 17.6 | 10.8 | 13.1 |
| $\frac{\text{Mol. Vol. of } MO_y}{\text{Atomic Vol. of } M}$ | 1.17 | 1.26 | 1.44 | 1.32 | 1.26 |

The table shows, inter alia, that the free energy of formation of the oxides of Sb, Sn, and In exceeds that of the oxides of Pb and Bi, implying an oxygen affinity of Sb, Sn, and In greater than that of Pb and Bi. It is thus possible that, as a result of doping, native oxide (e.g., PbO and/or $Bi_2O_3$) at the barrier/counter electrode interface is converted to the relevant dopant oxide. Such conversion can be expected to alter the barrier properties, e.g., the barrier thickness (because of the different molecular volumes of the two relevant oxides, as shown by the data in Table II). This mechanism is plausible and consistent with the observed behavior. However, the scope of our invention is independent of the nature of the mechanism that results in a change in a device parameter after incorporation of dopant into the device.

What is claimed is:

1. Method for producing a Josephson device comprising at least one Josephson junction, the method comprising
   (a) incorporating, subsequent to producing at least part of the device, an effective amount of dopant material into at least a part of the previously produced device part, and
   (b) maintaining at least the part of the device part at a reaction temperature above room temperature for a time effective for changing the value of at least one device parameter.

2. Method of claim 1, wherein the device parameter is the critical current, or the device parameter is the critical current density, or the device parameter is the quasi-particle resistance of the Josephson junction, or the device parameter is the inductance of a superconducting device component, or the device parameter is the resistivity of a normal device component.

3. Method of claim 2, wherein incorporating the dopant comprises depositing at least a part of the dopant material onto at least the surface of the device part.

4. Method of claim 2, wherein incorporating the dopant comprises implanting at least a part of the dopant material into at least the part of the device part.

5. Method of claim 2, wherein the dopant material consists essentially of material selected from the group consisting of In, Sn, Sb, Te, Bi, Au, Hg, Mg, Li, Cd, Na, and Ta.

6. Method of claim 2, wherein the Josephson device comprises at least one further superconducting device component.

7. Method of claim 2, wherein the Josephson device further comprises at least one normal device component.

8. Method of claim 2, wherein the Josephson device is a member of a multiplicity of Josephson devices formed on a substrate.

9. Method of claim 8, wherein, prior to incorporating the dopant, at least a part of at least one member of the multiplicity of devices is covered with a patterned masking layer, thereby substantially preventing incorporation of dopant into the covered part.

10. Method for fabricating a Josephson device comprising at least one Josephson junction, the junction comprising a superconducting base electrode and a superconducting counter electrode, at least a part of the counter electrode overlying at least a part of the base electrode, with a nonsuperconducting layer comprising a tunnel barrier region separating the base electrode and the counter electrode, at least the counter electrode comprising Pb, the method comprising (a) incorporating into at least the counter electrode an effective amount of dopant consisting essentially of material selected from the group consisting of In, Sn, Sb, Te, Bi, Au, Hg, Mg, Li, Cd, and Na, and (b) maintaining at least the counter electrode at a temperature above room temperature but not greater than about 200° C. for a time effective to produce a change in the current-voltage characteristic of the junction.

11. Method of claim 10, wherein the time is less than about 10 hours and the counter electrode is maintained at a temperature between about 50° C. and about 150° C.

12. Method of claim 10, wherein the amount of dopant corresponds to a dopant layer having an effective thickness less than 10 nm.

13. Method of claim 10, wherein the dopant material consists essentially of material selected from the group consisting of Sn, Sb, and In.

14. Method of claim 10, wherein at least part of the dopant material is incorporated into the counter electrode by ion implantation.

15. Method of claim 14, wherein the ion implantation has a projected range in the electrode less than about 50% of the electrode thickness.

16. Method of claim 10, wherein incorporating the dopant comprises depositing at least a part of the dopant material onto the surface of the counter electrode.

17. Method of claim 16, wherein depositing is by vapor deposition.

18. Method of claim 10, wherein the change in the voltage-current characteristic comprises a change in the critical current, or a change in the critical current density, or a change in the quasi-particle resistance.

19. Method of claim 10, wherein the Josephson junction is a member of a multiplicity of Josephson junctions formed on a substrate.

20. Method of claim 19, wherein, prior to incorporating the dopant, at least a part of at least one member of the multiplicity of junctions is covered with a patterned masking layer, thereby substantially preventing incorporation of dopant into the covered part.

* * * * *